(12) United States Patent
Ashizawa et al.

(10) Patent No.: US 6,407,010 B1
(45) Date of Patent: Jun. 18, 2002

(54) SINGLE-SUBSTRATE-HEAT-PROCESSING APPARATUS AND METHOD FOR SEMICONDUCTOR PROCESS

(75) Inventors: Hiroaki Ashizawa; Akinobu Kakimoto, both of Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/906,712

(22) Filed: Jul. 18, 2001

(30) Foreign Application Priority Data

Jul. 19, 2000 (JP) ........................................ 2000-219822

(51) Int. Cl.$^7$ ............................................... H01L 21/31
(52) U.S. Cl. .................... 438/785; 438/240; 438/660; 438/663; 438/665; 118/715; 118/719; 118/722
(58) Field of Search ................................ 438/785, 240, 438/396, 660, 663, 635; 118/715, 719, 722; 361/311

(56) References Cited

U.S. PATENT DOCUMENTS

| | | | | |
|---|---|---|---|---|
| 5,138,520 A | * | 8/1992 | McMillan et al. | 361/311 |
| 5,178,682 A | * | 1/1993 | Tsukamoto et al. | 118/722 |
| 5,479,197 A | * | 12/1995 | Fujikawa et al. | 347/63 |
| 5,580,468 A | * | 12/1996 | Fujikawa et al. | 216/27 |
| 5,622,607 A | * | 4/1997 | Yamazaki et al. | 204/192.15 |
| 5,766,498 A | * | 6/1998 | Kojima et al. | 216/71 |
| 5,968,379 A | * | 10/1999 | Zhao et al. | 219/121.52 |
| 6,126,753 A | * | 10/2000 | Shinriki et al. | 118/715 |
| 6,228,173 B1 | * | 5/2001 | Okase et al. | 118/719 |
| 6,319,766 B1 | * | 11/2001 | Bakli et al. | 438/240 |

* cited by examiner

*Primary Examiner*—John F. Niebling
*Assistant Examiner*—Olivia Luk
(74) *Attorney, Agent, or Firm*—Oblon, Spivak, McClelland, Maier & Neustadt, P.C.

(57) ABSTRACT

A single-substrate-heat-processing method performs a reformation process for a tantalum oxide film on a wafer and a crystallization process for this film in this order. In the reformation process and crystallization process, a heater is set at preset temperatures substantially equal to each other, and a pressure in a process chamber is set at first and second process pressures different from each other. A density of a gas present between a support surface and the wafer is changed by using the pressure in the process chamber as a parameter, and thus a heat transfer rate between the support surface and wafer is changed, thereby setting a wafer temperature at first and second process temperatures different from each other.

15 Claims, 4 Drawing Sheets

SINGLE-SUBSTRATE-HEAT-PROCESSING APPARATUS AND METHOD FOR SEMICONDUCTOR PROCESS

CROSS-REFERENCE TO RELATED APPLICATIONS

This application is based upon and claims the benefit of priority from the prior Japanese Patent Application No. 2000-219822, filed Jul. 19, 2000, the entire contents of which are incorporated herein by reference.

BACKGROUND OF THE INVENTION

1. Field of the Invention

The present invention relates to a single-substrate-heat-processing apparatus and method for a semiconductor process, which perform a process such as annealing, film formation, etching, oxidation, or diffusion. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

2. Description of the Related Art

In the process of manufacturing semiconductor devices, several types of heat-processing apparatuses are used for subjecting target substrates, such as semiconductor wafers, to a semiconductor process, such as annealing, film formation, etching, oxidation, or diffusion. A single-substrate-heat-processing apparatus, which handles wafers one by one, is known as one of these heat-processing apparatuses. The single-substrate-heat-processing apparatus allows a heat process to be relatively easily performed with a high planer uniformity on a wafer, even when the heat process requires the process temperature to be raised and lowered quickly. For this reason, the single-substrate-heat-processing apparatus has become popular, as the size of wafers has been larger, and the size of semiconductor devices has been smaller.

The process conditions, e.g., a process gas, a process temperature, and a process pressure, employed in the single-substrate-heat-processing apparatus largely change depending on the processing steps. For example, when a tantalum oxide film (Ta$_2$O$_5$), which recently attracts attention as a film with good insulating characteristics, is to be formed, heat-processing is performed in deposition, reformation, and crystallization of the film, and different process conditions are respectively employed in these processing steps.

In the manufacture of semiconductor devices, an increase in throughput is an important object in order to increase the mass productivity. As the cost necessary for maintaining the heat-processing apparatus is very high, it is required to reduce the number of units to be installed as small as possible. Under these circumstances, it has been proposed to perform similar processing steps, e.g., reformation and crystallization described above, continuously in a single heat-processing apparatus. Sometimes, however, the two processing steps have largely different process temperatures, like the processing steps of reformation and crystallization do. In this case, it takes time to change, particularly to increase, the temperature of the wafer. This decreases the throughput.

As a single-substrate-heat-processing apparatus, one with a structure that uses a heating lamp disposed under the worktable as a wafer heating source is known. This structure is advantageous in that it can increase the wafer temperature increase speed, while it is disadvantageous in that the window for transmitting light from the lamp therethrough is fogged from inside to likely decrease the heat efficiency and planar uniformity of heating. Therefore, depending on the contents of the process, an apparatus of this type is not appropriate as a mass-production apparatus.

In the most general single-substrate-heat-processing apparatus, a resistance heater disposed in the worktable is used as a wafer heating source. This structure is advantageous in that it can perform stable heating, while it is disadvantageous in that the wafer temperature increase rate decreases. In other words, it takes a comparatively long period of time since the amount of power to be supplied to the resistance heater is increased until the worktable and wafer reach a desired temperature.

BRIEF SUMMARY OF THE INVENTION

It is an object of the present invention to provide a single-substrate-heat-processing apparatus and method for a semiconductor process, which can perform a plurality of, e.g., two, processes with different process temperatures continuously and quickly.

According to a first aspect of the present invention, there is provided a processing method in a single-substrate-heat-processing apparatus for a semiconductor process, the apparatus including a hermetic process chamber, a worktable with a support surface where a target substrate is to be placed in the process chamber, and a heater disposed to heat the target substrate through the support surface, the method comprising the steps of:

placing the target substrate on the support surface;

subjecting the target substrate to a first process at a first process temperature and a first process pressure while heating the target substrate on the support surface with the heater; and subjecting the target substrate to a second process at a second process temperature and a second process pressure while heating the target substrate on the support surface with the heater, the first and second process pressures being different from each other and the first and second process temperatures being different from each other, wherein in the first and second processes, the heater is set at preset temperatures substantially equal to each other, and a pressure in the process chamber is set at the first and second process pressures, such that a density of a gas present between the support surface and the target substrate is changed by using the pressure in the process chamber as a parameter, and thus a heat transfer rate between the support surface and the target substrate is changed, thereby setting the target substrate at the first and second process temperatures.

According to a second aspect of the present invention, there is provided a processing method of performing a first process of reforming a metal oxide film on a target substrate and a second process of crystallizing the metal oxide. in this order, in a single-substrate-heat-processing apparatus for a semiconductor process, the apparatus including a hermetic process chamber, a worktable with a support surface where the target substrate is to be placed in the process chamber, and a heater disposed to heat the target substrate through the support surface, the method comprising the steps of: placing the target substrate on the support surface;

subjecting the target substrate to the first process at a first process temperature and a first process pressure while heating the target substrate on the support surface with the heater; and subjecting the target substrate to the second process at a second process temperature and a second process pressure while heating the target substrate on the support surface with the heater, the second process pressure being higher than the first process pressure, and the second process temperature being higher than the first process temperature, wherein in the first and second processes, the heater is set at preset temperatures substantially equal to each other, and a pressure in the process chamber is set at the first and second process pressures, such that a density of a gas present between the support surface and the target substrate is changed by using the pressure in the process chamber as a parameter, and thus a heat transfer rate between the support surface and the target substrate is changed, thereby setting the target substrate at the first and second process temperatures.

According to a third aspect of the present invention, there is provided a single-substrate-heat-processing apparatus for a semiconductor process, comprising:

a hermetic process chamber;

a worktable with a support surface where a target substrate is to be placed in the process chamber;

a heater disposed to heat the target substrate through the support surface;

a gas supply system for supplying a process gas into the process chamber;

a gas exhaust system for vacuum-exhausting an interior of the process chamber; and a controller for controlling the apparatus, the controller being adapted to set the heater at preset temperatures substantially equal to each other, and to set a pressure in the process chamber at first and second process pressures different from each other, such that a density of a gas present between the support surface and the target substrate is changed by using the pressure in the process chamber as a parameter, and thus a heat transfer rate between the support surface and the target substrate is changed, thereby setting the target substrate on the worktable at first and second process temperatures different from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Figure 1:
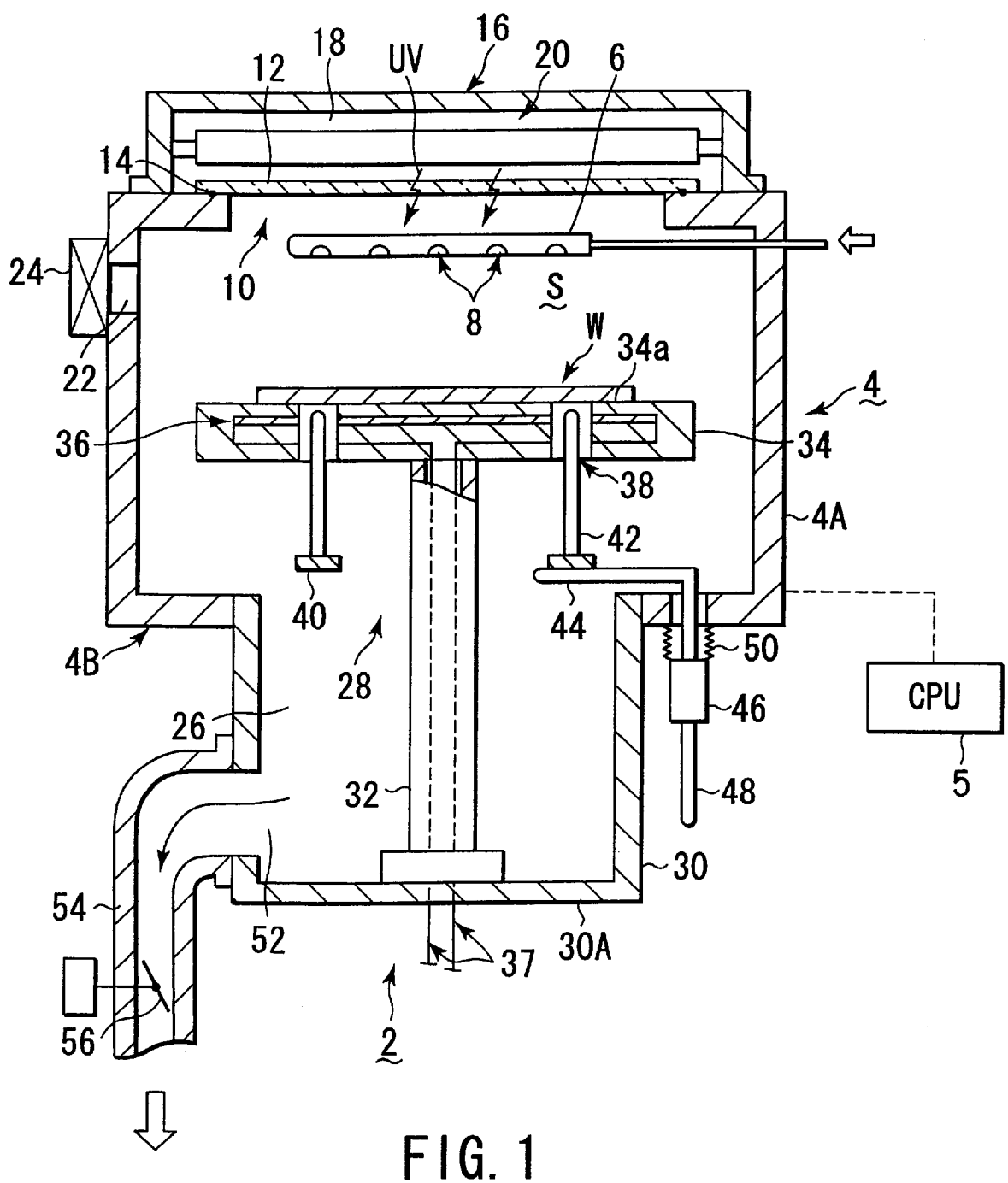
FIG. 1 is a sectional view showing a single-substrate-heat-processing apparatus according to an embodiment of the present invention.

The preferred embodiments of the present invention will be described with reference to the accompanying drawing. In the following description, the constituent elements having substantially the same functions and arrangements are denoted by the same reference numerals, and a repetitive explanation will be made only when it is necessary.

FIG. 1 is a sectional view showing a single-substrate-heat-processing apparatus according to an embodiment of the present invention. This heat-processing apparatus 2 is constituted to reform a metal oxide film such as a tantalum oxide film ($Ta_2O_5$) at a first temperature and to consecutively crystallize it at a second temperature higher than the first temperature. The operation of the heat-processing apparatus 2 is controlled by a CPU 5.

As shown in FIG. 1, for example, the heat-processing apparatus 2 has a process chamber 4 made of aluminum and with a substantially circular inner section. A ring-like showerhead 6 made of quartz is disposed at the ceiling in the process chamber 4 in order to introduce a necessary process gas. A number of gas spouting holes 8 are formed in the lower surface of the showerhead 6, so that the process gas is spouted toward a process space S.

The ceiling of the process chamber 4 has a large opening 10. For example, a transmission window 12 made of a quartz plate transparent to ultraviolet rays is hermetically attached to the opening 10 through a seal member 14 such as an O-ring. A lamp chamber 18 covered with a casing 16 is disposed above the transmission window 12. A plurality of ultraviolet lamps 20 are disposed in the lamp chamber 18. Ultraviolet rays UV emitted from the ultraviolet lamps 20 are introduced into the process space S through the transmission window 12.

A port 22, through which a semiconductor wafer W as a target substrate is to be loaded in/unloaded from the process chamber 4, is formed in a sidewall 4A of the process chamber 4. A gate valve 24, which is hermetically openable/closeable, is disposed in the port 22. The process chamber 4 is temperature-controlled by a temperature control medium (not shown).

A gas trap space 26 is formed in a bottom portion 4B of the process chamber 4. More specifically, the bottom portion 4B has a large opening 28 at its central portion. A bottomed cylindrical wall 30 is connected to the opening 28 to extend downward, and the space 26 is formed in it. A cylindrical column 32, for example, stands upright from a bottom portion 30A of the cylindrical wall 30 that defines the space 26.

A disk-like worktable 34 is fixed to the upper end of the column 32, and the wafer W is placed on a support surface 34a as the upper surface of the worktable 34. The worktable 34 is formed of a sintered ceramic table body made of, e.g., AlN. For example, the worktable 34 has, as a heater for heating the wafer W through the support surface 34a, a resistance heater 36 with a predetermined pattern and buried in the table body. The resistance heater 36 is connected to a feeder 37 disposed in the column 32, so a level-controlled power is supplied to the resistance heater 36.

The worktable 34 has a plurality of holes 38 vertically extending through it. Lifter pins 42 made of, e.g., quartz are respectively loosely inserted in the holes 38, with lower ends commonly connected to a connection ring 40. The lifter pins 42 serve as an assistant mechanism which assists loading/ unloading of the wafer W on/from the worktable 34 with an external transfer arm.

The connection ring 40 for supporting the lifter pins 42 is vertically driven by a lever 44. The lever 44 is connected to a piston rod 48 of an air cylinder 46 provided to the lower surface of the bottom portion 4B. The lifter pins 42 project upward from the upper ends of the corresponding holes 38 when transferring the wafer W. A bellows 50 is interposed between the air cylinder 46 and the lower surface of the bottom portion 4B. The piston rod 48 is vertically moved while the hermeticity in the process chamber 4 is maintained by the bellows 50.

The diameter of the opening at the inlet of the gas trap space 26 is smaller than that of the worktable 34. Hence, the process gas flowing downward outside the periphery of the worktable 34 goes under the worktable 34 to flow into the space 26. An exhaust port 52 is formed in the lower portion of the cylindrical wall 30. The exhaust port 52 is connected to a vacuum pump (not shown) through an exhaust pipe 54 in order to evacuate the atmospheres in the process chamber 4 and space 26.

A pressure adjustment valve 56, whose opening ratio is adjustable, is disposed midway along the exhaust pipe 54. The opening ratio of the pressure adjustment valve 56 is adjusted under the control of the CPU 5, so that the pressure in the process chamber 4 can be maintained at a constant value or can be quickly changed to a predetermined pressure.

How to set the process temperature for the wafer W in the apparatus 2 shown in FIG. 1 will be described.

Since a gap is present between the support surface 34a of the worktable 34 and the wafer W above it, a heat resistance exists between them depending on the state of the gap. When the wafer W is to be heated through the support surface 34a, the temperature (process temperature) for the wafer W is always lower than the temperature of the worktable 34 (to be also referred to as the preset temperature of the resistance heater 36 in the following description). Since the gas present between the support surface 34a and wafer W serves as a heat transfer medium, the heat transfer rate between them changes depending on the density of the gas. When the density of the gas between the support surface 34a and wafer W is increased, the heat transfer rate between them increases, and when the density of the gas is decreased, the heat transfer rate decreases. In other words, when the pressure in the process chamber 4 is high, the density of the gas and accordingly the heat transfer rate increase, and when the pressure in the process chamber 4 is low, the density of the gas and accordingly the heat transfer rate decrease.

In the apparatus 2 shown in FIG. 1, in setting the wafer W on the worktable 34 at the first and second process temperatures different from each other by utilizing this phenomenon, the CPU 5 sets the resistance heater 36 at temperatures substantially equal to each other, and the interior of the process chamber 4 at the first and second process pressures different from each other. When the temperature is to be directly shifted between the first and second process temperatures, the resistance heater 36 is maintained at substantially a constant preset temperature, while the pressure in the process chamber 4 is changed between the first and second process pressures. More specifically, the density of the gas present between the support surface 34a and wafer W is changed by using the pressure in the process chamber 4 as a parameter, thereby changing the heat transfer rate between the support surface 34a and wafer W. Thus, the temperature of the wafer W can be quickly changed between the first and second process temperatures.

For example, in order to apply this temperature control to a heat-processing method of reforming and furthermore crystallizing the tantalum oxide film (metal oxide film) formed on the semiconductor wafer W, assume a case wherein the temperature of the wafer W is to be changed from about 720° C. to about 747° C., as will be described later. In this case, when the temperature is increased by the resistance heater 36 in the worktable 34 at 6° C./min, with which the planar uniformity of the temperature of the wafer W can be obtained, in accordance with the conventional specification, it takes about 5 min for this temperature increase. In contrast to this, when the temperature of the wafer W is changed by using the pressure in the process chamber 4 as the parameter, this temperature increase can be performed in several seconds.

Figure 2:
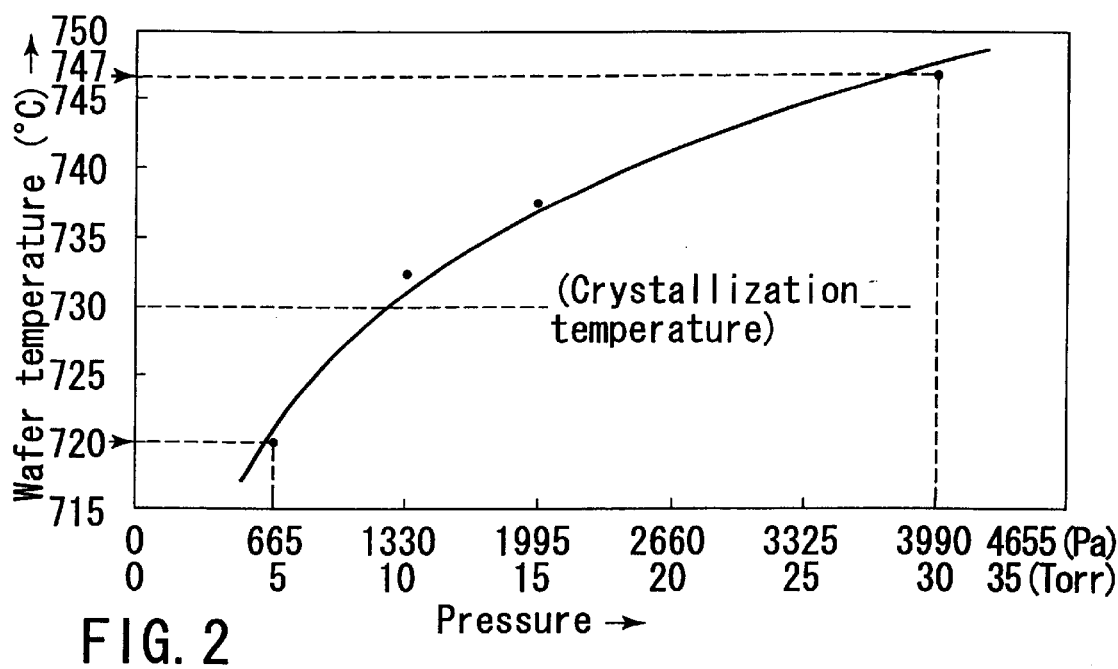
FIG. 2 is a graph showing the relationship between the pressure in a process chamber and the temperature of a semiconductor wafer itself in the apparatus shown in FIG. 1.

FIG. 2 is a graph showing the relationship between the pressure in the process chamber 4 and the temperature of the semiconductor wafer W itself in the apparatus 2 shown in FIG. 1. The data in FIG. 2 were obtained from an experiment with the following conditions. The temperature of the worktable 34 (preset temperature of the resistance heater 36) was fixed to 898° C. As an inert gas, $N_2$ gas was supplied into the process chamber 4 at a flow rate of 10 L/min. As shown in FIG. 2, the pressure in the process chamber 4 was changed from about 665 Pa (5 Torr) to about 3,990 Pa (30 Torr). As a result, in spite that the temperature of the worktable 34 was constant, the temperature of the wafer W changed from about 720° C. to about 747° C.

In FIG. 2, 730° C. is the crystallization temperature of the tantalum oxide film ($Ta_2O_5$). The tantalum oxide film can be almost crystallized by annealing it at 730° C. for at least about 2 min. As described above, while the wafer temperature changes from about 720° C. to about 747° C., the tantalum oxide film experiences 730° C., which is its crystallization temperature. Therefore, if the reformation process is performed under a process pressure of, e.g., about 665 Pa and then the pressure in the process chamber is increased so the crystallization process is performed under a process pressure of, e.g., about 3,990 Pa, two heat-processing processes at different process temperatures can be performed while maintaining a constant preset temperature of the resistance heater 36.

Figure 3:
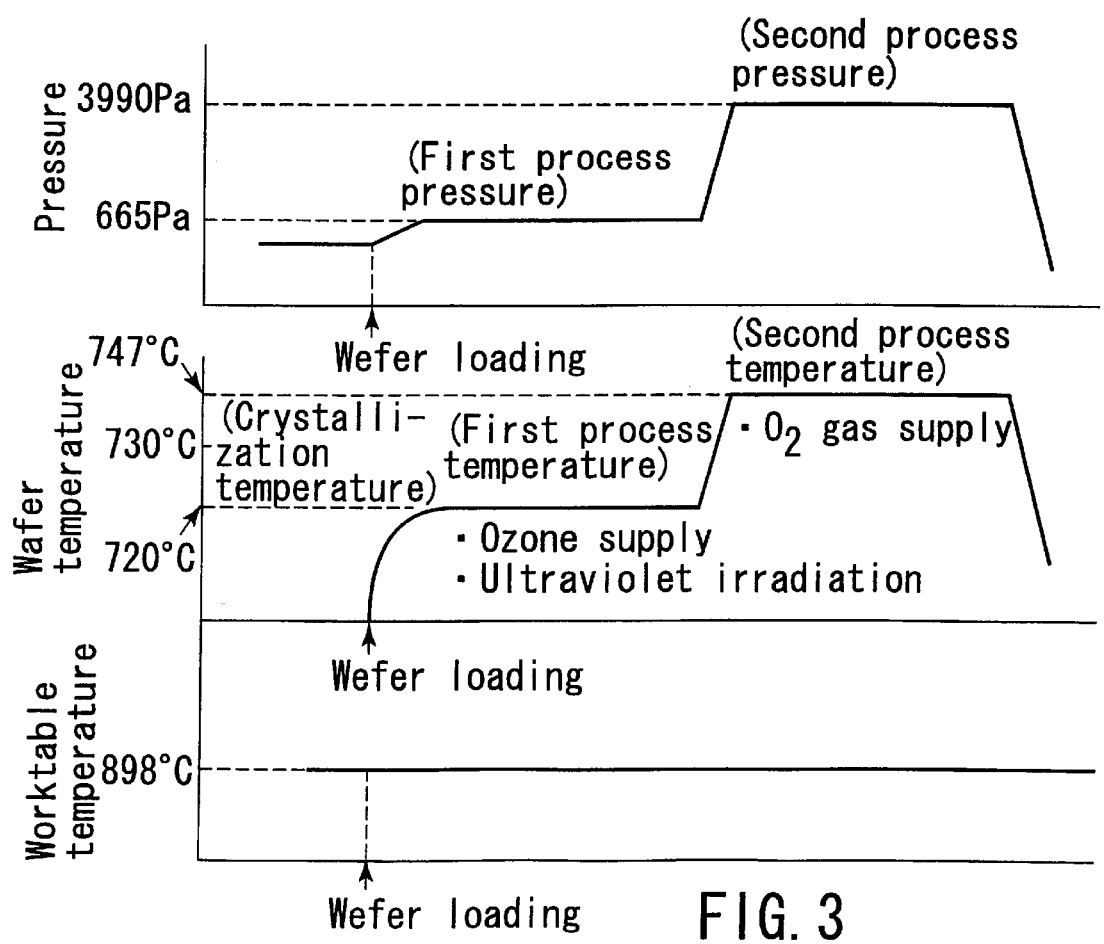
FIG. 3 is a graph showing the relationship among the pressure in a process chamber, the wafer temperature, and the worktable temperature (i.e., heater preset temperature) in a single-substrate-heat-processing method according to an embodiment of the present invention.
Figure 4:
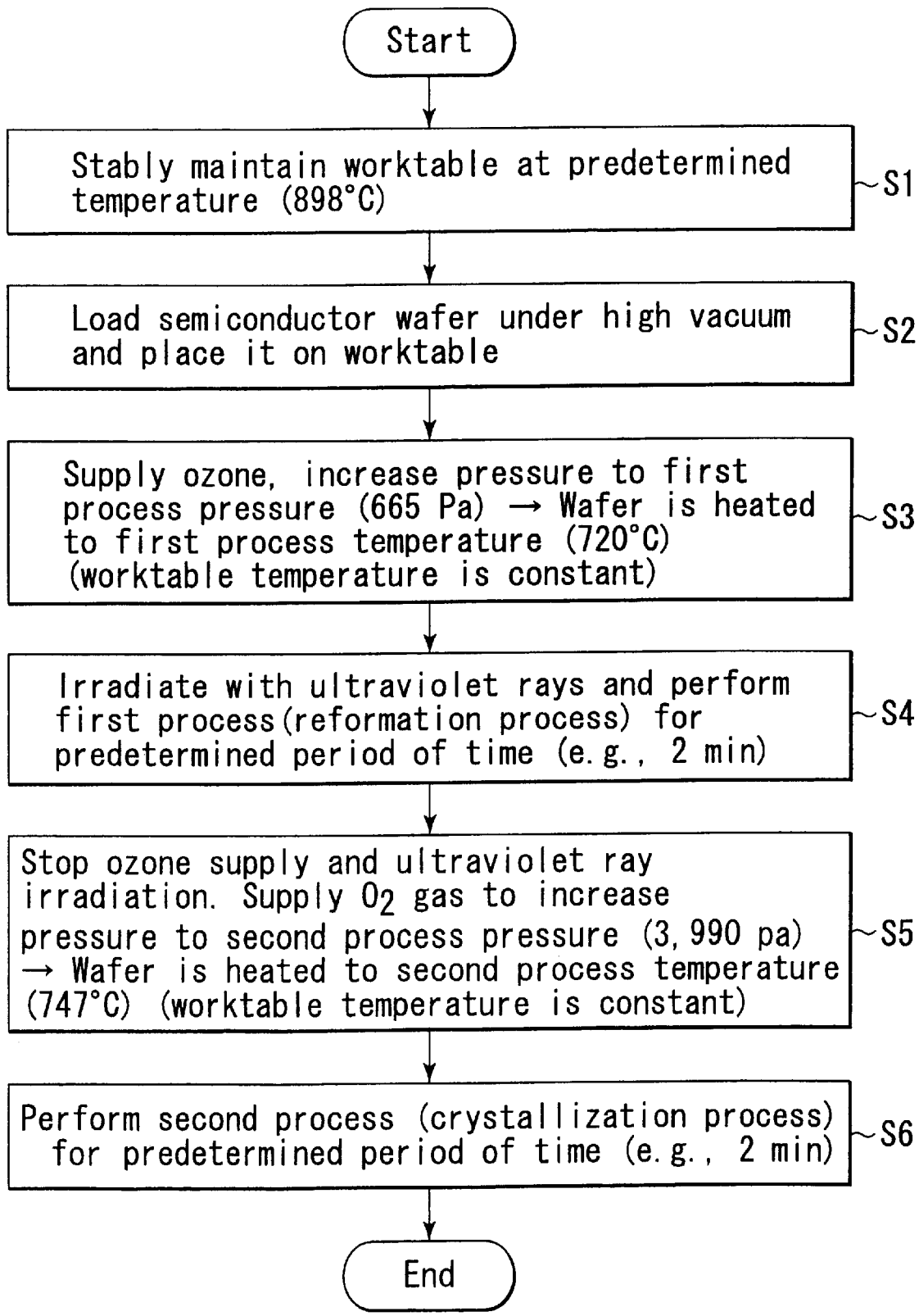
FIG. 4 is a flow chart showing this heat-processing method.

A single-substrate-heat-processing method performed in the apparatus 2 shown in FIG. 1 will be described. This heat-processing method is performed under the control of the CPU 5 that controls the operation of the apparatus 2 shown in FIG. 1. In this heat-processing method, the process of reforming (oxidizing) the tantalum oxide film (metal oxide film) formed on the semiconductor wafer W at the first process temperature, e.g., about 720° C., and the process of crystallizing this film at the second process temperature, e.g., about 747° C., are performed continuously as will be described hereinafter. FIG. 3 is a graph showing the relationship among the pressure in the process chamber, the wafer temperature, and the worktable temperature (i.e., heater preset temperature) of this heat-processing method. FIG. 4 is a flow chart showing this heat-processing method.

A tantalum oxide film has already been deposited on a wafer W to be processed to a predetermined thickness in a previous step. Prior to loading of the wafer W, the interior of the process chamber 4 is evacuated. The worktable 34 where the wafer W is to be placed is heated in advance by the resistance heater 36 serving as a heating means to a preset temperature (the preset temperature of the resistance heater 36), e.g., about 898° C., higher than the second process temperature, and is stably maintained at this temperature (step S1).

In this state, first, the wafer W to be processed is held by the external transfer arm (not shown) and loaded from a load-lock chamber (not shown) connected to the process chamber 4 into the process chamber 4 through the open gate valve 24 and port 22. The wafer W is transferred to the lifter pins 42 elevated to the uppermost position. Then, the lifter pins 42 move downward to place the wafer W on the support surface 34a of the worktable 34 (step S2). At this time, the pressure in the process chamber 4 is set to almost the same pressure as the first process pressure for the reformation process.

Subsequently, for example, ozone is spouted and supplied as a process gas from the showerhead 6 to the process space S. The vacuum pump (not shown) provided to the exhaust pipe 54 is continuously driven while adjusting the opening ratio of the pressure adjustment valve 56, to evacuate the atmospheres in the process chamber 4 and space 26. Thus, the atmosphere in the process space S is set to the first process pressure of about 665 Pa for the reformation process, and the wafer W is set to the first process temperature of about 720° C. Meanwhile, the preset temperature of the resistance heater 36 (temperature of the worktable 34) is maintained at a constant value (step S3).

Simultaneously, the ultraviolet lamps 20 are driven, and the ultraviolet rays UV emitted from them are transmitted through the transmission window 12 in the ceiling to radiate the surface of the wafer W. Thus, the tantalum oxide film on the surface of the wafer W is reformed (oxidized) by ozone activated by the ultraviolet rays UV, and is annealed simultaneously. Meanwhile, the interior of the process chamber 4 is maintained at the first process pressure, and the wafer W is maintained at the first process temperature. In this manner, the reformation process is performed for a predetermined period of time, e.g., 2 min (step S4).

When the reformation process is ended, irradiation of the ultraviolet rays UV and supply of ozone are stopped. A process gas for the crystallization process, e.g., $O_2$ gas, is supplied from the showerhead 6 to replace the ozone gas. At the same time, the opening ratio of the pressure adjustment valve 56 is adjusted, and the atmosphere in the process space S is pressurized from the first process pressure of about 665 Pa to the second process pressure of about 3,990 Pa for the crystallization process. By this pressure increase, in spite that the preset temperature of the resistance heater 36 (temperature of the worktable 34) stays constant, the temperature of the wafer W increases from the first process temperature of about 720° C. to the second process temperature of about 747° C. for the crystallization process. The time necessary for this pressure increase and temperature increase is as very short as about 5 seconds (step S5).

Since the wafer W is maintained at the second process temperature higher than 730° C. as the crystallization temperature of the tantalum oxide film, the tantalum oxide film on the surface of the wafer W is crystallized. During this crystallization, the interior of the process chamber 4 is maintained at the second process pressure, and the wafer W is maintained at the second process temperature. In this manner, the crystallization process is performed for a predetermined period of time, e.g., 2 min (step S6). As the process gas for the crystallization process, an inert gas such as $N_2$ gas, or $N_2O$ gas can be used in place of $O_2$ gas.

After the crystallization process is ended, the processed wafer W is unloaded. A new unprocessed wafer is loaded in the process chamber 4, and the operation described above is repeatedly performed.

In this manner, the process temperature for the wafer W itself can be quickly changed by only changing the pressure in the process chamber 4 while the temperature of the worktable 34 (preset temperature of the resistance heater 36) is maintained at the constant value. Therefore, two processes with different process temperatures, i.e., the reformation process and crystallization process in this case, can be performed quickly in one process chamber 4 without decreasing the throughput.

Furthermore, unlike the prior art, the two processes need not be performed separately by different heat-processing apparatuses. Since the time required for transfer of the wafer becomes unnecessary, the throughput can be further increased accordingly. Since one heat-processing apparatus suffices, the facility cost can be reduced accordingly.

In the above embodiment, the reformation process for the tantalum oxide film is performed in the first process, and the crystallization process for the tantalum oxide film is performed in the second process. Therefore, the first and second process temperatures necessary for the reformation process and crystallization process may be set to interpose a certain temperature at which the tantalum oxide film can start being crystallized. For example, in the case of the tantalum oxide film, the first process temperature is set between 200° C. and 730° C., and preferably between 700° C. and 730° C. The second process temperature is set between 600° C. and 750° C., and preferably between 730° C. and 750° C. The first process temperature is set lower than the second process temperature. The upper limit of the second process temperature depends on the heat resistant temperatures of various types of deposition films formed under the tantalum oxide film, and generally falls within a range of, e.g., about 600° C. to 750° C.

The first and second process pressures for the reformation process and crystallization process are selected such that they are appropriate for the respective processes and that the first and second process temperatures described above can be obtained with the temperature of the worktable 34 (preset temperature of the resistance heater 36) being maintained at substantially the same value. More specifically, in light of the process temperatures of the tantalum oxide film described above, where the preset temperature of the resistance heater falls within a range of 800° C. to 900° C., the first and second process pressures are set as follows. The first process pressure is set between 13.3 Pa to 1064 Pa, and preferably between 133 Pa and 931 Pa. The second process pressure is set between 1330 Pa and 6650 Pa, and preferably between 1339 Pa and 3990 Pa.

Note that the preset temperature of the resistance heater, process temperatures, process pressures described above relate only to the reformation process and the crystallization process of the tantalum oxide film. Where a reformation process and a crystallization process of another metal oxide film are performed, or other two heat processes are performed, conditions different from those described above are used. In other words, the present invention is not at all limited by the preset temperature of the resistance heater, process temperatures, process pressures described above.

Figure 5:
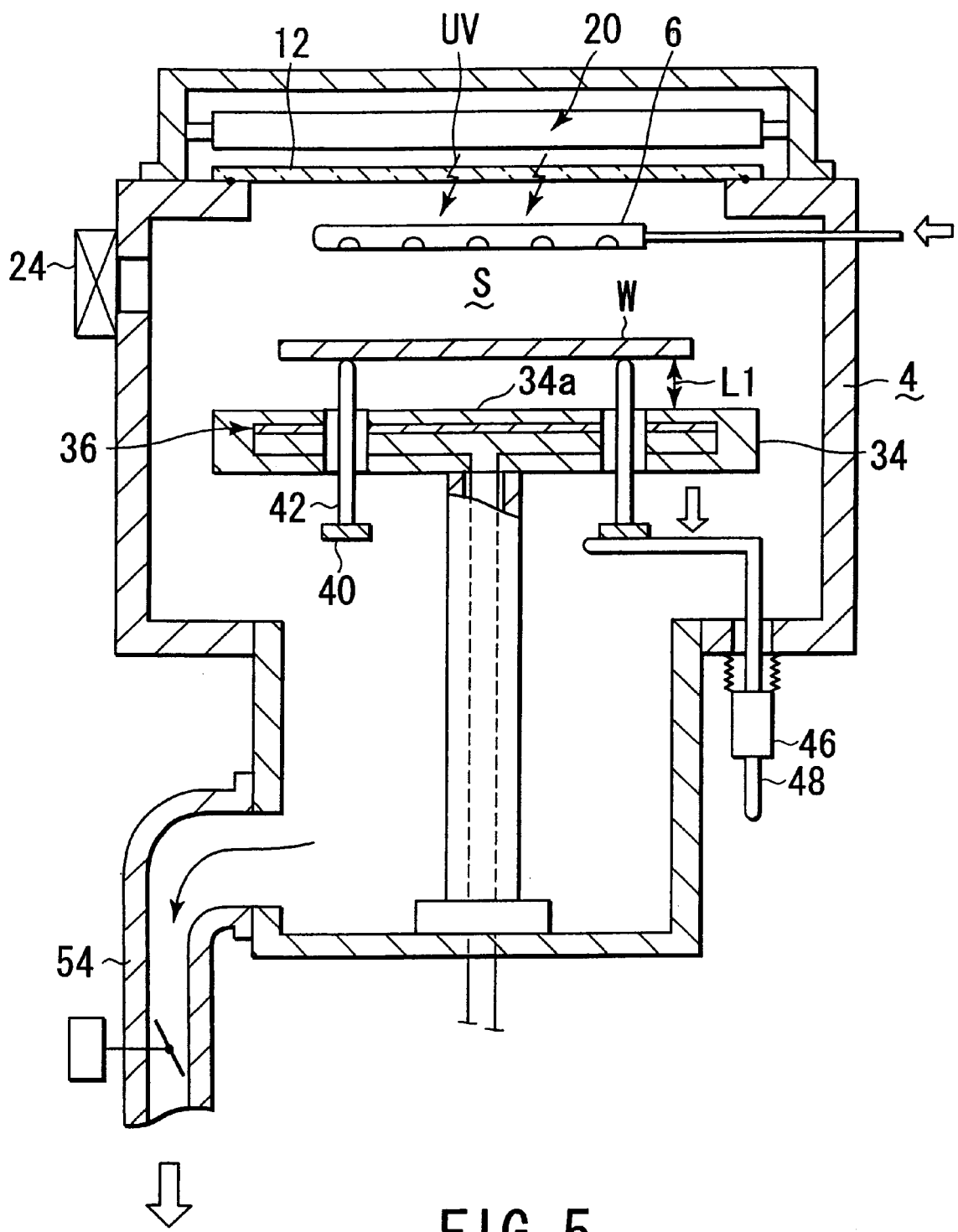
FIG. 5 is a sectional view of the apparatus, for explaining a single-substrate-heat-processing method according to another embodiment of the present invention.

In the above embodiment, the temperature change amount is about 27° C. (=747° C.−720° C.). This temperature change amount can be increased by increasing the pressure difference between the first and second process pressures. To further increase this temperature change amount, the first process may be performed with the wafer W being lifted from the worktable 34. For example, as shown in FIG. 5, the reformation process is performed with the wafer W being lifted from the support surface 34a with the lifter pins 42 by a predetermined distance L1, e.g., about 3 mm. When the crystallization process is to be performed, the process pressure is increased, as described above, and the lifter pins 42 are moved down to place the wafer W on the worktable 34.

In this case, in the first heat process, the process pressure is set low, as described above. In addition, since the wafer W is separated from the worktable 34 incorporating the resistance heater 36, the first process temperature can be further decreased. Furthermore, when the distance L1 between the wafer W and support surface 34a is arbitrarily changed, the first process temperature can be changed.

In the embodiments described with reference to FIGS. 1 to 5, the preset temperature of the resistance heater 36 (temperature of the worktable 34) is maintained at a constant value through the reformation process to the crystallization process. Alternatively, the temperature of the worktable 34 may be changed within a range not adversely affecting the throughput. The first and second processes requiring different process temperatures can be performed in any order. More specifically, depending on the types of the target film or the types of the heat process, the first process may be performed after the second process requiring a higher process temperature. As the heating means, a heat lamp may be used in place of the resistance heater.

In the above embodiments, the tantalum oxide film exemplifying a metal oxide film is continuously subjected to the reformation process and the crystallization process. Note that the present invention can be applied to any case wherein two types of processes requiring different process temperatures are performed continuously. Furthermore, for example, a metal oxide film other than the tantalum oxide film can be a film made of PZT (an oxide of Pb, Zr, and Ti), or BSTO (an oxide of Ba, Sr, and Ti). The present invention can also be applied to processes other than reformation and crystallization, e.g., film formation such as CVD, etching, oxidation, and diffusion. The present invention can also be applied to a target substrate other than a semiconductor wafer, e.g., an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A processing method in a single-substrate-heat-processing apparatus for a semiconductor process, the apparatus including a hermetic process chamber, a worktable with a support surface where a target substrate is to be placed in the process chamber, and a heater disposed to heat the target substrate through the support surface, the method comprising the steps of:
   placing the target substrate on the support surface;
   subjecting the target substrate to a first process at a first process temperature and a first process pressure while heating the target substrate on the support surface with the heater; and
   subjecting the target substrate to a second process at a second process temperature and a second process pressure while heating the target substrate on the support surface with the heater, the first and second process pressures being different from each other and the first and second process temperatures being different from each other,
   wherein in the first and second processes, the heater is set at preset temperatures substantially equal to each other, and a pressure in the process chamber is set at the first and second process pressures, such that a density of a gas present between the support surface and the target substrate is changed by using the pressure in the process chamber as a parameter, and thus a heat transfer rate between the support surface and the target substrate is changed, thereby setting the target substrate at the first and second process temperatures.

2. The method according to claim 1, wherein the second process pressure is higher than the first process pressure, and the second process temperature is higher than the first process temperature.

3. The method according to claim 1, further comprising a step of shifting the temperature of the target substrate between the first and second process temperatures, wherein the temperature of the target substrate is shifted by changing the pressure in the process chamber between the first and second process pressures while maintaining the heater at substantially a constant preset temperature.

4. The method according to claim 2, wherein the first process is a process of reforming a metal oxide film on the target substrate, the second process is a process of crystallizing the metal oxide film, and the first process is performed prior to the second process.

5. The method according to claim 4, wherein the preset temperature of the heater is not less than a crystallization temperature of the metal oxide film.

6. The method according to claim 4, wherein the metal oxide film is a tantalum oxide film, and the preset temperature of the heater is between 800° C. and 900° C.

7. The method according to claim 6, wherein the first and second process pressures are respectively between 13.3 Pa to 1064 Pa, and between 1330 Pa and 6650 Pa.

8. The method according to claim 4, wherein in the first process, an oxidizing gas is supplied into the process chamber.

9. The method according to claim 4, wherein in the second process, a gas selected from the group consisting Of $O_2$, $N_2$, and $N_2O$ is supplied into the process chamber.

10. The method according to claim 1, wherein the heater comprises a resistance heater disposed in the worktable.

11. A processing method of performing a first process of reforming a metal oxide film on a target substrate and a second process of crystallizing the metal oxide in this order, in a single-substrate-heat-processing apparatus for a semiconductor process, the apparatus including a hermetic process chamber, a worktable with a support surface where the target substrate is to be placed in the process chamber, and a heater disposed to heat the target substrate through the support surface, the method comprising the steps of:
   placing the target substrate on the support surface;

subjecting the target substrate to the first process at a first process temperature and a first process pressure while heating the target substrate on the support surface with the heater; and subjecting the target substrate to the second process at a second process temperature and a second process pressure while heating the target substrate on the support surface with the heater, the second process pressure being higher than the first process pressure, and the second process temperature being higher than the first process temperature, wherein in the first and second processes, the heater is set at preset temperatures substantially equal to each other, and a pressure in the process chamber is set at the first and second process pressures, such that a density of a gas present between the support surface and the target substrate is changed by using the pressure in the process chamber as a parameter, and thus a heat transfer rate between the support surface and the target substrate is changed, thereby setting the target substrate at the first and second process temperatures.

12. The method according to claim 11, further comprising a step of shifting the temperature of the target substrate between the first and second process temperatures, wherein the temperature of the target substrate is shifted by changing the pressure in the process chamber between the first and second process pressures while maintaining the heater at substantially a constant preset temperature.

13. The method according to claim 11, wherein the preset temperature of the heater is not less than a crystallization temperature of the metal oxide film.

14. The method according to claim 11, wherein in the first process, an oxidizing gas is supplied into the process chamber.

15. The method according to claim 11, wherein in the second process, a gas selected from the group consisting Of $O_2$, $N_2$, and $N_2O$ is supplied into the process chamber.

* * * * *